(12) United States Patent
Nakamura (10) Patent No.: US 11,866,798 B2
(45) Date of Patent: Jan. 9, 2024

(54) METHOD FOR MANUFACTURING MAGNETOSTRICTIVE TORQUE SENSOR SHAFT

(71) Applicant: Hitachi Metals, Ltd., Tokyo (JP)

(72) Inventor: Teruyuki Nakamura, Tokyo (JP)

(73) Assignee: PROTERIAL, LTD., Tokyo (JP)

( * ) Notice: Subject to any disclaimer, the term of this patent is extended or adjusted under 35 U.S.C. 154(b) by 136 days.

(21) Appl. No.: 15/854,102

(22) Filed: Dec. 26, 2017

(65) Prior Publication Data

US 2018/0195142 A1     Jul. 12, 2018

(30) Foreign Application Priority Data

Jan. 11, 2017    (JP) ................................ 2017-002547

(51) Int. Cl.
     *C21D 9/00*         (2006.01)
     *C21D 9/28*         (2006.01)
     (Continued)

(52) U.S. Cl.
     CPC .............. *C21D 9/0075* (2013.01); *B24C 1/10* (2013.01); *C21D 6/004* (2013.01); *C21D 7/06* (2013.01);
     (Continued)

(58) Field of Classification Search
     CPC .......... C21D 6/002; C21D 6/004; C21D 7/06; C21D 8/065; C21D 8/12; C21D 8/1216;
     (Continued)

(56) References Cited

U.S. PATENT DOCUMENTS 4,811,609 A * 3/1989 Nishibe ................... G01L 3/102
                                                          73/862.333
5,186,059 A * 2/1993 Ishino ..................... G01L 3/102
                                                          73/862.193

(Continued)

FOREIGN PATENT DOCUMENTS

CN        102877070 A * 1/2013 ............... C21D 7/06
EP          1178123 A1 * 6/2002 ............... C21D 8/12

(Continued)

OTHER PUBLICATIONS

English Machine Translation of Ishino et al (JP H04-246123 A) (Year: 1992).*

(Continued)

*Primary Examiner* — Keith Walker
*Assistant Examiner* — Adil A. Siddiqui
(74) *Attorney, Agent, or Firm* — Thomas W. Cole; Calderon Safran & Cole P.C.

(57) ABSTRACT

Provided is a method for manufacturing a magnetostrictive torque sensor shaft mounting a sensor portion of a magnetostrictive torque sensor. The method includes conducting heat treatment on a shaft material including chrome steel or chrome-molybdenum steel by carburizing, quenching and tempering, and conducting shot peening on the shaft material after the heat treatment at least on a position where the sensor portion is to be mounted. The shot peening is conducted by firing shot with a particle size of not less than 0.6 mm and a Rockwell hardness of not less than 60 at a jet pressure of not less than 0.4 MPa for a jet exposure time of not less than 2 minutes.

20 Claims, 8 Drawing Sheets

(51) Int. Cl.
*B24C 1/10* (2006.01)
*C21D 6/00* (2006.01)
*C21D 7/06* (2006.01)
*C21D 8/06* (2006.01)
*C21D 8/12* (2006.01)
*G01L 3/10* (2006.01)
*B24C 3/32* (2006.01)
*B24C 11/00* (2006.01)

(52) U.S. Cl.
CPC .......... *C21D 8/065* (2013.01); *C21D 8/1216* (2013.01); *C21D 8/1255* (2013.01); *C21D 8/1277* (2013.01); *C21D 9/28* (2013.01); *G01L 3/103* (2013.01); *B24C 3/322* (2013.01); *B24C 11/00* (2013.01)

(58) Field of Classification Search
CPC .. C21D 8/1255; C21D 8/1277; C21D 8/1294; C21D 9/075; C21D 2211/001; C21D 2211/008; C21D 7/00; C21D 7/02; C21D 7/04; C21D 8/06; B24C 1/10; B24C 1/00; G01L 3/102; G01L 3/103; G01L 3/00; G01L 3/02; G01L 3/04; G01L 3/10; G01L 3/101; G01L 3/104; G01L 3/105; B21D 31/06; B24B 39/006; B23P 9/04
USPC ................................ 148/120, 206
See application file for complete search history.

(56) References Cited

U.S. PATENT DOCUMENTS

| | | | | |
|---|---|---|---|---|
| 5,205,145 | A * | 4/1993 | Ishino | G01L 3/102 29/90.7 |
| 2002/0078765 | A1* | 6/2002 | Shinoura | G01L 3/102 73/862.333 |
| 2005/0204830 | A1* | 9/2005 | Kuroda | G01L 3/102 73/862.331 |
| 2010/0252150 | A1* | 10/2010 | Xue | C21D 1/25 148/567 |
| 2010/0300168 | A1* | 12/2010 | Ishikura | B24C 1/10 72/53 |
| 2011/0024003 | A1* | 2/2011 | Vartanov | C21D 1/28 148/327 |
| 2018/0195142 | A1 | 7/2018 | Nakamura | |

FOREIGN PATENT DOCUMENTS

| | | | | |
|---|---|---|---|---|
| JP | H02-090030 | A | | 3/1990 |
| JP | H03-229852 | A | | 10/1991 |
| JP | H04-246123 | A * | 4/1992 | ............... C21D 7/06 |
| JP | 2001-228037 | A | | 8/2001 |
| JP | 2002-340701 | A | | 11/2002 |
| JP | 2002340701 | A * | 11/2002 | |
| JP | 2004-198349 | A | | 7/2004 |
| JP | 2018-112451 | A | | 7/2018 |

OTHER PUBLICATIONS

Schneider, Introduction to Surface Hardening of Steels, revised 2013. ASM Handbook, vol. 4 A, Steel Heat Treating Fundamentals and Processes (Year: 2013).*
Cammett, Understanding the Peening Time Paradox, 2014. The Shot Peener, Spring 2014, pp. 10-14 (Year: 2014).*
Carburizing Heat Treating, 2016. Bluewater Thermal Solutions (Year: 2016).*
Moser et al., Martensite Formation in Conventional and Isothermal Tension of 304 Austenitic Stainless Steel Measured by X-ray Diffraction, 2014. Metallurgical and Materials Transactions A, vol. 45A, pp. 4891-4896 (Year: 2014).*
Japanese Steels and Alloys, SCr 420H, 2018-2019. SteelJIS (Year: 2018).*
Moore, Sarah. "How Does Twice-Tempered Steel Work?", 2014. Seattle Post-Intelligencer. (Year: 2014).*
"Conversion Chart of Vickers Hardness (HV) to Rockwell C (HRC)", 2001. Taylor Special Steels (Year: 2001).*
Office Action issued in the corresponding JP Patent Application No. 2017-002547 dated Apr. 7, 2020.
Office Action issued in the corresponding CN Patent Application No. 201810024073.2 dated Oct. 29, 2020.
Office Action issued in the corresponding Japanese Patent Application No. 2020-115375 dated Mar. 4, 2021.
Office Action issued in the corresponding Chinese Patent Application No. 201810024073.2 dated Jul. 6, 2021.

* cited by examiner

METHOD FOR MANUFACTURING MAGNETOSTRICTIVE TORQUE SENSOR SHAFT

The present application is based on Japanese patent application No. 2017-002547 filed on Jan. 11, 2017, the entire contents of which are incorporated herein by reference.

BACKGROUND OF THE INVENTION

1. Field of the Invention

The invention relates to a method for manufacturing a magnetostrictive torque sensor shaft.

2. Description of the Related Art

Magnetostrictive torque sensors known are used on a magnetostrictive shaft with magnetic permeability varying according to applied stress, and are configured such that variation in magnetic permeability of the shaft when distorted under the applied torque is detected as variation in inductance of a detection coil, thereby detecting torque applied to the shaft (see, e.g., JP 2002/340701 A).

SUMMARY OF THE INVENTION

A known steel material used for the magnetostrictive shaft includes a non-magnetic microstructure called austenite. The austenite is a solid solution of γ-iron having a face-centered cubic lattice structure with another element.

If a large amount of non-magnetic austenite is included in the shaft, variation in magnetic permeability when torque is applied may be small, causing a decrease in sensitivity of magnetostrictive torque sensor.

However, if the amount of austenite in the entire shaft is reduced by, e.g., adjusting the heat treatment conditions, toughness of the shaft may be reduced, causing a crack in the shaft.

Also, hysteresis which may cause an error (linearity error, hereinafter, referred to as hysteresis error) should be as small as possible.

It is an object of the invention to provide a method for manufacturing a magnetostrictive torque sensor shaft that allows an improvement in sensor sensitivity and a reduction in hysteresis error while ensuring toughness.

According to an embodiment of the invention, a method for manufacturing a magnetostrictive torque sensor shaft mounting a sensor portion of a magnetostrictive torque sensor comprises:

conducting heat treatment on a shaft material comprising chrome steel or chrome-molybdenum steel by carburizing, quenching and tempering; and conducting shot peening on the shaft material after the heat treatment at least on a position where the sensor portion is to be mounted, wherein the shot peening is conducted by firing shot with a particle size of not less than 0.6 mm and a Rockwell hardness of not less than 60 at a jet pressure of not less than 0.4 MPa for a jet exposure time of not less than 2 minutes.

(Effects of the Invention)

According to an embodiment of the invention, a method for manufacturing a magnetostrictive torque sensor shaft can be provided that allows an improvement in sensor sensitivity and a reduction in hysteresis error while ensuring toughness.

BRIEF DESCRIPTION OF THE DRAWINGS

Next, the present invention will be explained in more detail in conjunction with appended drawings, wherein:

FIGS. 1A and 1B are diagrams illustrating an example of a sensor portion of a magnetostrictive torque sensor, wherein

FIGS. 2A and 2B are schematic exploded plan views showing a bobbin, wherein

FIGS. 5A and 5B are graphs showing the test results when using chrome steel (SCr420) as a shaft material, wherein

FIGS. 7A and 7B are graphs showing the test results when using chrome-molybdenum steel (SCM420) as a shaft material, wherein

DETAILED DESCRIPTION OF THE PREFERRED EMBODIMENTS

Embodiment

An embodiment of the invention will be described below in conjunction with the appended drawings.

Description of Magnetostrictive Torque Sensor

Figure 1A:
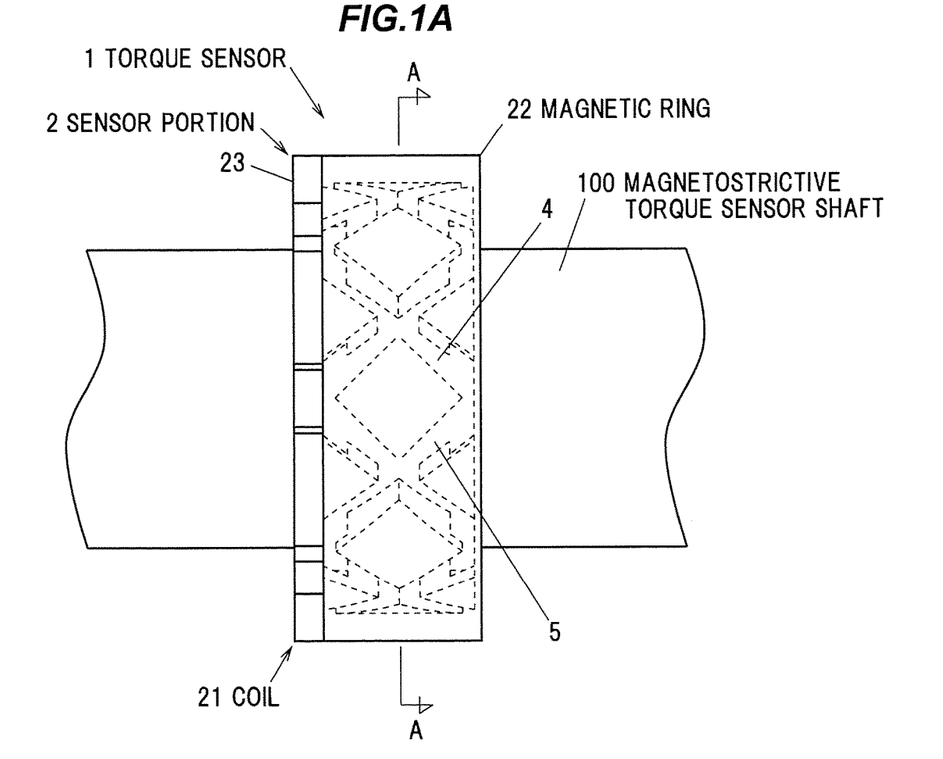
FIG. 1A is a side view when attached to a shaft and FIG. 1B is a cross sectional view taken on line A-A of FIG. 1A.
Figure 1B:
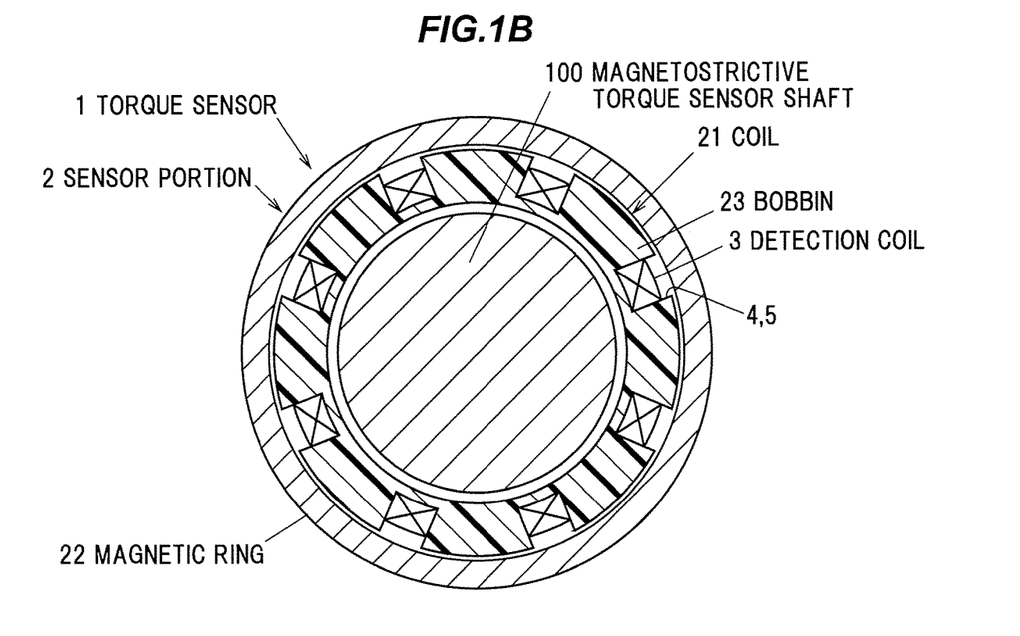
Figure 2A:
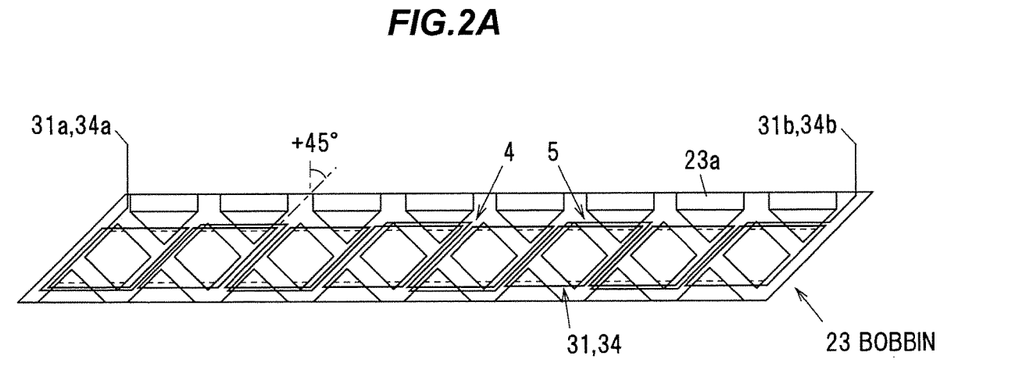
FIG. 2A is an explanatory diagram illustrating first and fourth detection coils and FIG. 2B is an explanatory diagram illustrating second and third detection coils.
Figure 2B:
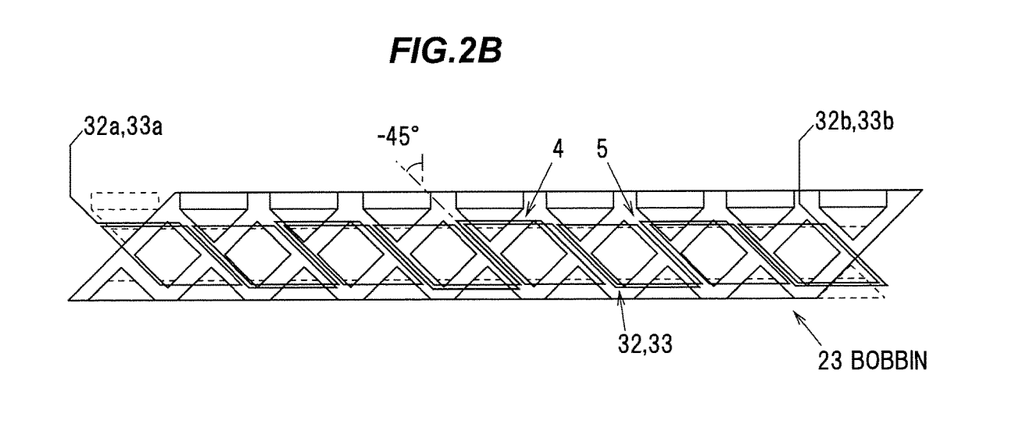
Figure 3:
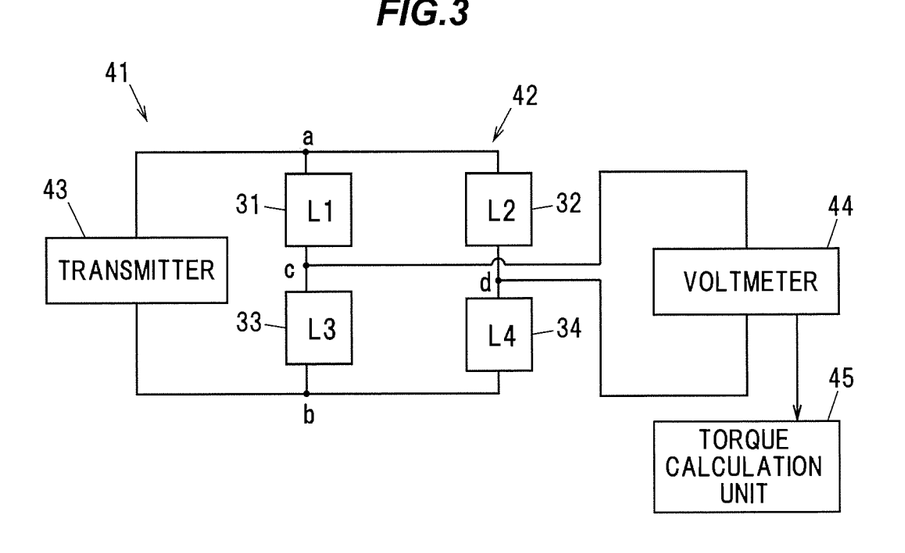
FIG. 3 is a circuit diagram illustrating an example of a measurement portion which measures torque applied to the shaft based on a detection signal of the torque sensor.

Firstly, a magnetostrictive torque sensor (hereinafter, simply referred to as "torque sensor") will be described in reference to FIGS. 1A to 3. FIGS. 1A and 1B are diagrams illustrating an example of a sensor portion of a torque sensor, wherein FIG. 1A is a side view when attached to a shaft and FIG. 1B is a cross sectional view taken on line A-A of FIG. 1A. FIGS. 2A and 2B are schematic exploded plan views showing a bobbin, wherein FIG. 2A is an explanatory diagram illustrating first and fourth detection coils and FIG. 2B is an explanatory diagram illustrating second and third detection coils. FIG. 3 is a circuit diagram illustrating an example of a measurement portion which measures torque applied to the shaft based on a detection signal of the torque sensor.

As shown in FIGS. 1A and 1B, a sensor portion 2 of a torque sensor 1 is attached around a magnetostrictive torque sensor shaft (hereinafter, simply referred as "shaft") 100 which has magnetostrictive properties. The torque sensor 1 is to measure torque (rotational torque) applied to the shaft 100.

The shaft 100 is formed of a magnetostrictive material and has a columnar shape (bar shape). The shaft 100 is, e.g., a shaft used to transfer torque in a powertrain system in a vehicle, or a shaft used to transfer torque of engine in a vehicle.

The sensor portion 2 is provided with a coil 21 and a magnetic ring 22. The magnetic ring 22 is formed of a magnetic material (ferromagnetic material) and is formed into a hollow cylindrical shape. The coil 21 is inserted into the hollow of the magnetic ring 22. The magnetic ring 22 serves to prevent a magnetic flux generated by detection coils 3 of the coil 21 from leaking to the outside and thereby to suppress a decrease in sensitivity.

The coil 21 has a bobbin 23 formed of a resin which is a non-magnetic material, and plural detection coils 3 formed by winding insulated wires around the bobbin 23. The bobbin 23 is formed into a hollow cylindrical shape and is provided coaxially with and at a distance from the shaft 100. Plural first inclined grooves 4 and plural second inclined grooves 5 are formed on the outer peripheral surface of the bobbin 23. The first inclined grooves 4 are inclined at a predetermined angle (+45 degrees in this example) relative to an axial direction of the shaft 100, and the second inclined grooves 5 are inclined at a predetermined angle (−45 degrees in this example) relative to the axial direction in a direction opposite to the first inclined grooves 4. The first inclined grooves 4 and the second inclined grooves 5 are formed of grooves which are dent in a radial direction of the bobbin 23.

As shown in FIGS. 2A and 2B, the coil 21 has first to fourth detection coils 31 to 34 which are the detection coils 3. The first detection coil 31 and the fourth detection coil 34 are formed by winding insulated wires around the bobbin 23 along the first inclined grooves 4. The second detection coil 32 and the third detection coil 33 are formed by winding insulated wires around the bobbin 23 along the second inclined grooves 5.

In FIG. 2A, start and finish ends of one layer of the first detection coil 31 are respectively denoted by 31*a* and 31*b*, and start and finish ends of one layer of the fourth detection coil 34 are respectively denoted by 34*a* and 34*b*. In FIG. 2B, start and finish ends of one layer of the second detection coil 32 are respectively denoted by 32*a* and 32*b*, and start and finish ends of one layer of the third detection coil 33 are respectively denoted by 33*a* and 33*b*. In FIGS. 2A and 2B, an insulated wire is wound one turn. Each of the detection coils 31 to 34 is formed by repeating this process of winding the insulated wire until reaching a desired number of turns. The method of winding the insulated wire shown in FIGS. 2A and 2B is an example, and the detection coils 31 to 34 may be formed by another winding method.

The first detection coil 31 and the fourth detection coil 34 are provided to detect variation in magnetic permeability of the shaft 100 in a first direction which is inclined at a predetermined angle (+45 degrees in this example) relative to the axial direction of the shaft 100. Also, the second detection coil 32 and the third detection coil 33 are provided to detect variation in magnetic permeability of the shaft 100 in a second direction which is inclined at a predetermined angle toward the opposite side (−45 degrees in this example) relative to the axial direction of the shaft 100.

As shown in FIG. 3, a measurement portion 41 detects variation in inductances of the first to fourth detection coils 31 to 34 and thereby measures torque applied to the rotating shaft 100.

The measurement portion 41 is provided with a bridge circuit 42, a transmitter 43, a voltage measurement circuit 44 and a torque calculation unit 45. The bridge circuit 42 is formed by annularly connecting the first detection coil 31, the second detection coil 32, the fourth detection coil 34 and the third detection coil 33 in this order. The transmitter 43 applies AC voltage to a junction a between the first detection coil 31 and the second detection coil 32 and to a junction b between the third detection coil 33 and the fourth detection coil 34. The voltage measurement circuit 44 detects voltage between junctions c and d, the junction c between the first detection coil 31 and the third detection coil 33 and the junction d between the second detection coil 32 and the fourth detection coil 34. The torque calculation unit 45 calculates torque applied to the shaft 100 based on the voltage measured by the voltage measurement circuit 44. The bridge circuit 42 is configured such that the first detection coil 31 and the fourth detection coil 34 are arranged on a pair of opposite sides and the second detection coil 32 and the third detection coil 33 are arranged on another pair of opposite sides.

In the measurement portion 41, when torque is not applied to the shaft 100, the inductances L1 to L4 of the first to fourth detection coils 31 to 34 are equal to each other and voltage detected by the voltage measurement circuit 44 is substantially zero.

When torque is applied to the shaft 100, magnetic permeability in a direction of +45 degrees relative to the axial direction decreases (or increases) and magnetic permeability in a direction of −45 degrees relative to the axial direction increases (or decreases). Thus, when torque is applied to the shaft 100 in a state in which AC voltage is applied from the transmitter 43, inductances of the first detection coil 31 and the fourth detection coil 34 decrease (or increase) and inductances of the second detection coil 32 and the third detection coil 33 increase (or decrease). As a result, voltage detected by the voltage measurement circuit 44 varies. Based on the variation in voltage, the torque calculation unit 45 calculates torque applied to the shaft 100.

Since the configuration of the first and fourth detection coils 31 and 34 is entirely the same as the configuration of the second and third detection coils 32 and 33 except the winding direction, an effect of temperature, etc., on inductances of the first to fourth detection coils 31 to 34 can be cancelled out by using the bridge circuit 42 as shown in FIG. 3 and it is thus possible to accurately detect torque applied to the shaft 100. In addition, in the torque sensor 1, when the inductances of the first detection coil 31 and the fourth detection coil 34 increase (or decrease), the inductances of the second detection coil 32 and the third detection coil 33 always decrease (or increase). Therefore, it is possible to further improve detection sensitivity by using the bridge circuit 42 as shown in FIG. 3.

Description of the Shaft 100 and Manufacturing Method Thereof

The shaft 100 in the present embodiment is formed of a chrome steel (SCr) or chrome-molybdenum steel (SCM) shaft material which is treated by carburizing, quenching and tempering and is then shot peened.

That is, the method for manufacturing the shaft 100 in the present embodiment includes a heat treatment step to treat a chrome steel or chrome-molybdenum steel shaft material by carburizing, quenching and tempering, and a shot peening step to conduct shot peening on the shaft material after the heat treatment step at least on a position where the sensor portion 2 is to be mounted.

By carburizing, quenching and tempering the entire shaft material, it is possible to increase mechanical strength, including toughness, of the shaft 100.

Then, the shot peening further conducted on the shaft material after the heat treatment can cause martensitic transformation (diffusionless transformation) with a reduction in non-magnetic austenite and an increase in ferromagnetic martensite on the surface (a region from the surface to a predetermined depth) of the shaft 100. Due to the reduction of the non-magnetic region and the increase in the magnetic region on the surface of the shaft 100, variation in magnetic permeability under applied torque increases and sensitivity of the torque sensor 1 is thus improved. The austenite here is a solid solution of iron (γ-iron) having a face-centered cubic lattice structure with another element, and the martensite is a solid solution in which carbon enters into a crystal of iron having a body-centered tetragonal lattice.

In addition, the shot peening conducted on the shaft material after the heat treatment work-hardens the surface of the shaft material and improves hysteresis characteristics. In more detail, the shot peening conducted on the shaft material after the heat treatment finely divides magnetic domains (areas with aligned magnetic moments) on the surface of the shaft 100 and reduces austenite to be a pinning site which interrupts movement of domain walls as interfaces separating magnetic domains. As a result, the magnetic domains or the domain walls are likely to return to the original state upon release of the applied torque, and hysteresis error is reduced.

Figure 4:
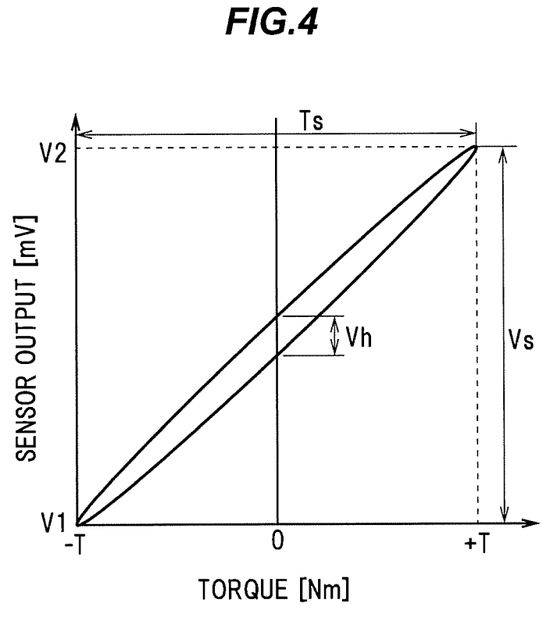
FIG. 4 is a diagram for explaining sensitivity and hysteresis error.

Sensitivity of the torque sensor 1 is obtained by dividing sensor output V (mV) by torque T (Nm) applied to the shaft 100 as shown in FIG. 4, and is represented by V/T (mV/Nm). The sensor sensitivity is represented by (V2−V1)/(2× T1)=Vs/Ts, when torque T applied to the shaft 100 is not less than −T1 and not more than +T1, and where sensor output corresponding to torque −T1 is V1, and sensor output corresponding to torque +T1 is V2. Meanwhile, hysteresis error, also called linearity error, is a ratio of a maximum value Vh of a sensor output difference at the same torque between when torque is increasing and when torque is decreasing, with respect to sensor output Vs (=V2−V1), and is represented by Vh/Vs (% FS, where FS stands for full scale).

In the present embodiment, the optimum shot peening conditions when using chrome steel (SCr420) as the shaft material for the shaft 100 and when using chrome-molybdenum steel (SCM420) were examined. Table 1 shows the components of chrome steel (SCr420) and chrome-molybdenum steel (SCM420) which were used. Table 2 shows the respective heat treatment conditions.

TABLE 2

|  |  | Chrome steel SCr420 | Chrome-molybdenum steel SCM420 |
|---|---|---|---|
| Heat treatment | 1 | Carburizing at 930° C. for 3 hours, liquid carburizing | |
|  | 2 | Quenching at 800° C. for 20 minutes, in salt water (medium-temperature salt bath) | |
|  | 3 | Oil cooling, marquenching in 180° C. solution for 20 minutes, and subsequent water cooling for 15 minutes | |
|  | 4 | Tempering at 180° C. for 1 hour, in salt water (low-temperature salt bath) | |
|  | 5 | Water cooling, about 60 minutes | |
|  | 6 | Tempering at 180° C. for 2 hours | |
|  | 7 | Air cooling | |
|  | 8 | Tempering at 170° C. for 2 hours | |
|  | 9 | Air cooling | |
| Hardness after heat treatment |  | HRC 59-62 | HRC 59-62 |

In the present embodiment, the hardness of the shaft material after the heat treatment step is a HRC of not less than 59 and not more than 62, as shown in Table 2. This is because if the hardness of the shaft material after the heat treatment step is low, sensor sensitivity may decrease or hysteresis error may increase. To prevent worsening of sensor sensitivity and hysteresis error, the hardness of the shaft material after the heat treatment step is desirably a HRC of not less than 58. In other words, the heat treatment step is preferably conducted so that the shaft material after the heat treatment step has a HRC of not less than 58. However, if the hardness of the shaft material after the heat treatment step is too high, toughness may be reduced, leading to a decrease in conductance as the shaft 100. Therefore, the hardness of the shaft material after the heat treatment is desirably a HRC of not more than 62, more desirably, a HRC of not less than 59 and not more than 62.

Shot used for shot peening in the present embodiment is formed of steel with a particle size of 0.6 mm and a HRC (Rockwell hardness) of 60. Then, shot peening is conducted at a jet pressure of 0.4 MPa (denoted by P4) or 0.55 MPa (denoted by P5) for a jet exposure time of 2 minutes (denoted by M2), 5 minutes (denoted by M5) or 10 minutes (denoted by M10).

In the test, a relation between torque and sensor output (see FIG. 4) was obtained while changing torque applied to the shaft 100 from 0, 10, 20, 30, 40, 50, 40, 30, 20, 10, 0, −10, −20, −30, −40, −50, −40, −30, −20, −10 to 0 (unit: Nm), and sensor sensitivity and hysteresis error were calculated based on the obtained relation. The same test was conducted at temperatures of 150° C., 20° C. and −40° C.

Figure 5A:
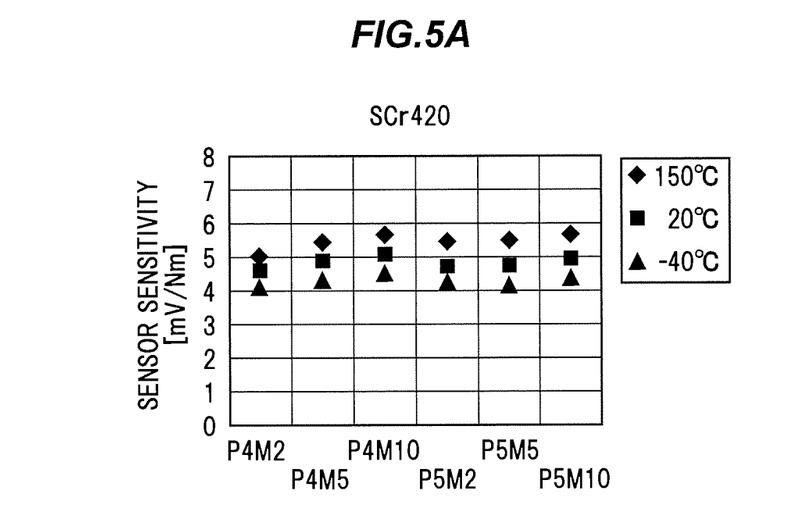
FIG. 5A shows the measurement results of sensor sensitivity with shot peening under various conditions and FIG. 5B shows the measurement results of hysteresis error with shot peening under the various conditions.
Figure 5B:
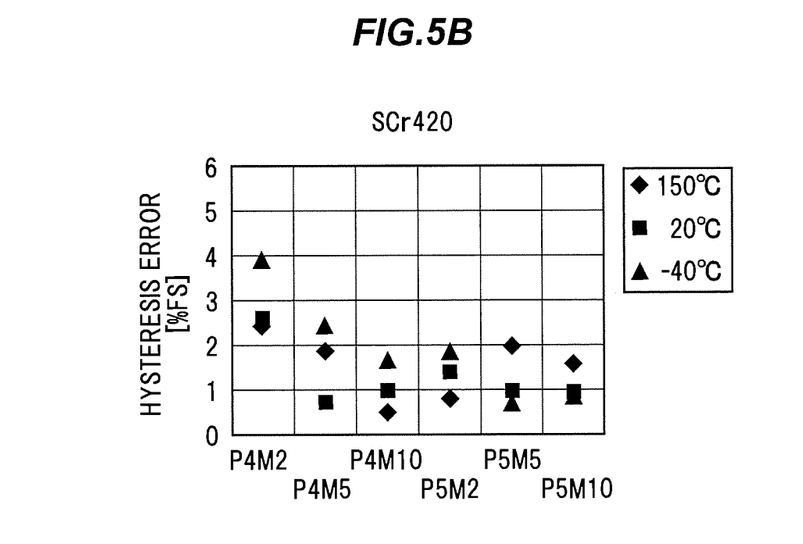

The test result when using chrome steel (SCr420) as the shaft material is shown in FIGS. 5A and 5B. Regarding the notations on the horizontal axis in FIGS. 5A and 5B, for example, P4M2 means that the jet pressure is 0.4 MPa and

TABLE 1

| | Components (mass %) | | | | | | | |
|---|---|---|---|---|---|---|---|---|
| | C | Si | Mn | P | S | Ni | Cr | Mo |
| Chrome steel SCr420 | 0.17-0.23 | 0.15-0.35 | 0.55-0.95 | Not more than 0.03 | Not more than 0.03 | Not more than 0.25 | 0.90-1.20 | — |
| Chrome-molybdenum steel SCM420 | 0.18-0.23 | 0.15-0.35 | 0.60-0.90 | Not more than 0.03 | Not more than 0.03 | Not more than 0.25 | 0.90-1.20 | 0.15-0.25 |

*Balance: Fe the jet exposure time is 2 minutes. On the horizontal axis in FIGS. 5A and 5B, jet energy for shot peening increases generally from left to right.

As shown in FIGS. 5A and 5B, when using chrome steel (SCr420), longer jet exposure time and higher jet pressure are more effective to improve sensor sensitivity and to reduce hysteresis error. In other words, sensor sensitivity and hysteresis error are more improved with a larger shot peening jet energy.

Where the same test was conducted as to a non-shot-peened sample, sensor sensitivity was about 2 mV/Nm and hysteresis error was about 6% FS. Thus, when using a chrome steel shaft material and shot with a particle size of 0.6 mm and a HRC of 60, the effect of improving sensor sensitivity and reducing hysteresis error is obtained at least at a jet pressure of not less than 0.4 MPa and a jet exposure time of not less than 2 minutes.

The torque sensor 1 desirably has a sensor sensitivity of not less than 4 mV/Nm and hysteresis error of not more than 3%. Therefore, it is preferable to conduct shot peening at a jet pressure of not less than 0.4 MPa and less than 0.55 MPa for a jet exposure time of not less than 5 minutes, or at a jet pressure of not less than 0.55 MPa for a jet exposure time of not less than 2 minutes, so as to achieve sensor sensitivity of not less than 4 mV/Nm and hysteresis error of not more than 3%.

Furthermore, to reduce the overall hysteresis error to not more than 3% by taking account of influence of noise or rotation of the shaft 100 (influence of decentering of the rotational axis), hysteresis error in a state of not being affected by such influences is desirably reduced to not more than 2%, and it is thus preferable to conduct shot peening at jet pressure of not less than 0.4 MPa and less than 0.55 MPa for a jet exposure time of not less than 10 minutes, or at a jet pressure of not less than 0.55 MPa for a jet exposure time of not less than 2 minutes. However, when the jet exposure time is more than 10 minutes, it takes time to produce the shaft 100 and mass productivity may decrease. Therefore, in view of increasing mass productivity, the shot peening step is preferably conducted at jet pressure of not less than 0.55 MPa for a jet exposure time of not less than 2 minutes.

Since sensor sensitivity and hysteresis error are more improved with a larger jet energy as described above, it is desirable that the shot have as large particle size and high hardness as possible. Based on the test result shown in FIGS. 5A and 5B, it is possible to improve sensor sensitivity and hysteresis error at least by using the shot with a particle size of not less than 0.6 mm and a HRC of not less than 60 (HV of not less than 700) and conducting shot peening at jet pressure of not less than 0.4 MPa for a jet exposure time of not less than 2 minutes.

Where the present inventors conducted shot peening by firing shot with a particle size of 0.35 mm and a HV (Vickers hardness) of 1200, hysteresis error was reduced but sensor sensitivity was not improved sufficiently. Also, where shot peening was conducted by firing shot with a particle size of 0.8 mm and a HRC of 60, the obtained result was substantially the same as when using the shot with a particle size of 0.6 mm and a HRC of 60. If the particle size of the shot is too large, roughness of the surface of the shaft 100 is increased and error may be thereby increased. Therefore, the particle size of the shot is desirably not less than 0.6 mm and not more than 0.8 mm.

Also, when the jet pressure during shot peening is set to too high, it is necessary to use a special shot peening machine to ensure safety and the cost is thus increased. On the assumption that a general shot peening machine is used, the jet pressure during shot peening is desirably not less than 0.4 MPa and not more than 0.6 MPa in view of ensuring safety.

Figure 6A:
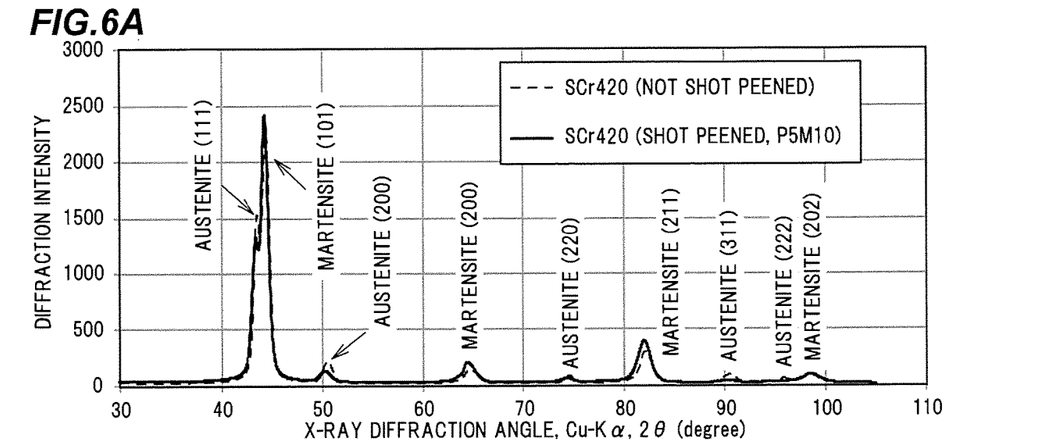
FIGS. 6A to 6C are graphs showing the result of an X-ray diffraction test conducted on the sample P5M10 of FIG. 5 and a non-shot-peened sample.
Figure 6B:
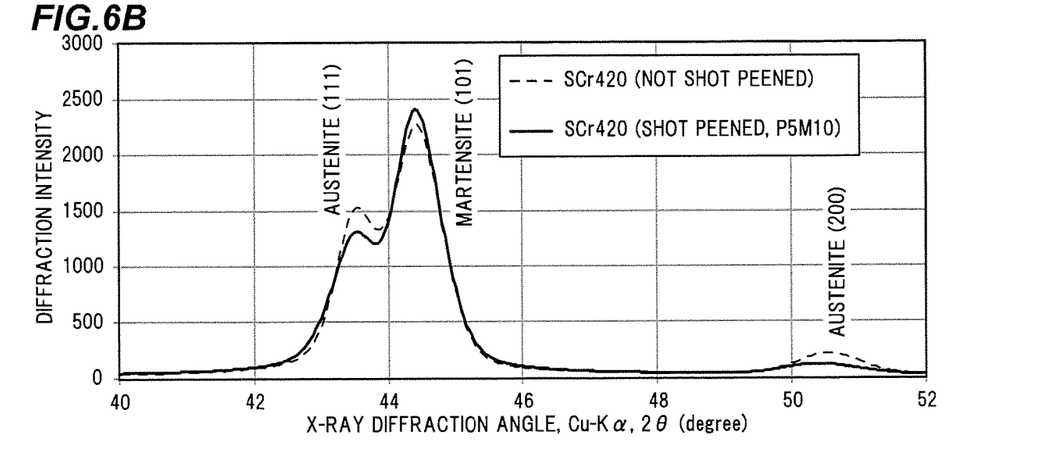
Figure 6C:
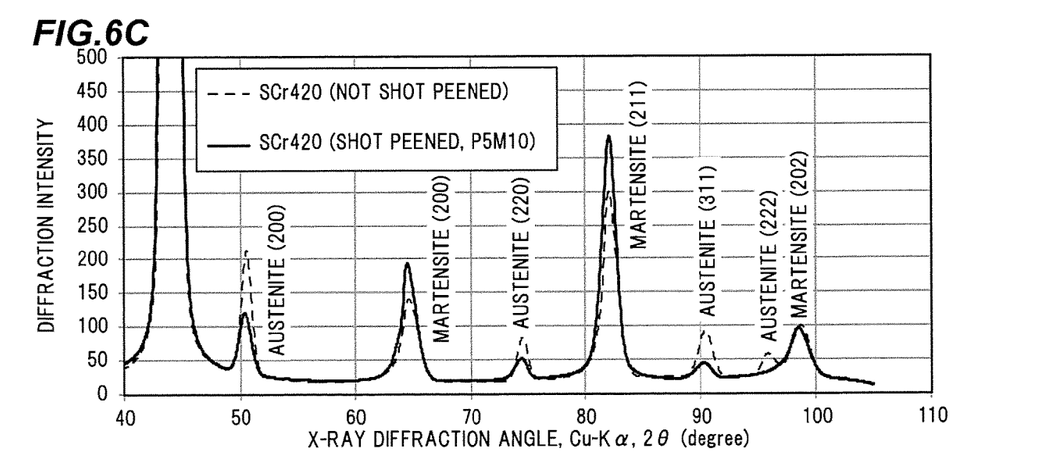

Next, an X-ray diffraction test was conducted on the sample (P5M10) prepared at a jet pressure of 0.5 MPa for a jet exposure time of 2 minutes. In the X-ray diffraction test, a short columnar sample having a diameter of 20 mm and a thickness of 5 mm was exposed to Cu-Kα radiation. The results of the X-ray diffraction test are shown in FIGS. 6A to 6C. Here, FIG. 6A is partially enlarged and shown in FIGS. 6B and 6C. In FIGS. 6A to 6C, the result from a non-shot-peened sample is also shown for the purpose of comparison.

As shown in FIGS. 6A to 6C, the sample of the invention (shot-peened, P5M10) has less non-magnetic austenite and more ferromagnetic martensite than the non-shot-peened sample in the prior art example, and thus can improve sensor sensitivity. In FIGS. 6A to 6C, the numbers noted in brackets represent Miller indices. In addition, the unit of diffraction intensity on the vertical axis in FIGS. 6A to 6C is cps (counts per second).

As shown in FIG. 6C, a magnitude relation between the peak value of austenite with a Miller index of (200) and the peak value of martensite with a Miller index of (200) in the invention is a reverse of that in the prior art example. In other words, while the peak value of austenite (200) is larger than the peak value of martensite (200) in the prior art example, the peak value of austenite (200) is smaller than the peak value of martensite (200) in the invention. As a result of the examination by the present inventors, it was found that the higher the peaks value of especially the martensite (200) and martensite (211), the more reduced the hysteresis error at low temperature. To reduce hysteresis error at low temperature, the peak values of the martensite (200) and martensite (211) are desirably not less than 1.15 times the peak values before conducting shot peening.

Figure 7A:
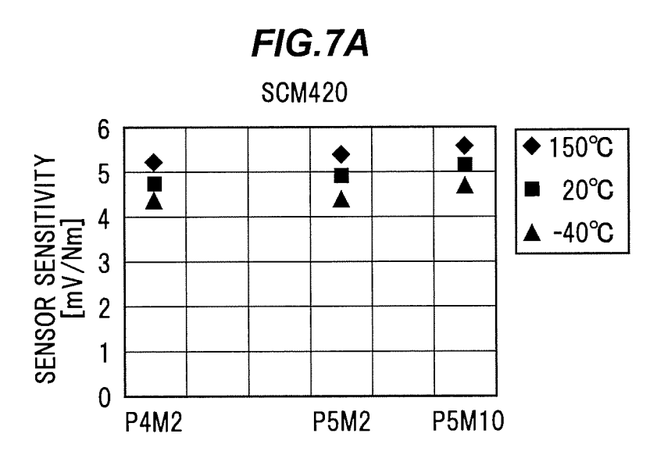
FIG. 7A shows the measurement results of sensor sensitivity with shot peening under various conditions and FIG. 7B shows the measurement results of hysteresis error with shot peening under the various conditions.
Figure 7B:
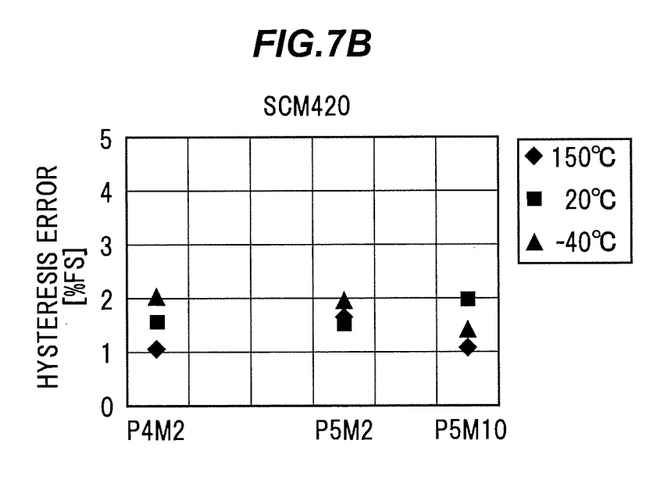

Next, the test result when using chrome-molybdenum steel (SCM420) is shown in FIGS. 7A and 7B. The test conditions are the same as those for chrome steel in FIGS. 5A and 5B. When using chrome-molybdenum steel, sensor sensitivity of not less than 4 mV/Nm and hysteresis error of about not more than 2% were achieved under any conditions of P4M2, P5M2 and P5M10, as shown in FIGS. 7A and 7B. Thus, it is possible to obtain the sufficient effect of improving sensor sensitivity and reducing hysteresis error at least by using the shot with a particle size of not less than 0.6 mm and a HRC of not less than 60 (HV of not less than 700) and conducting shot peening at a jet pressure of not less than 0.4 MPa for a jet exposure time of not less than 2 minutes.

Figure 8A:
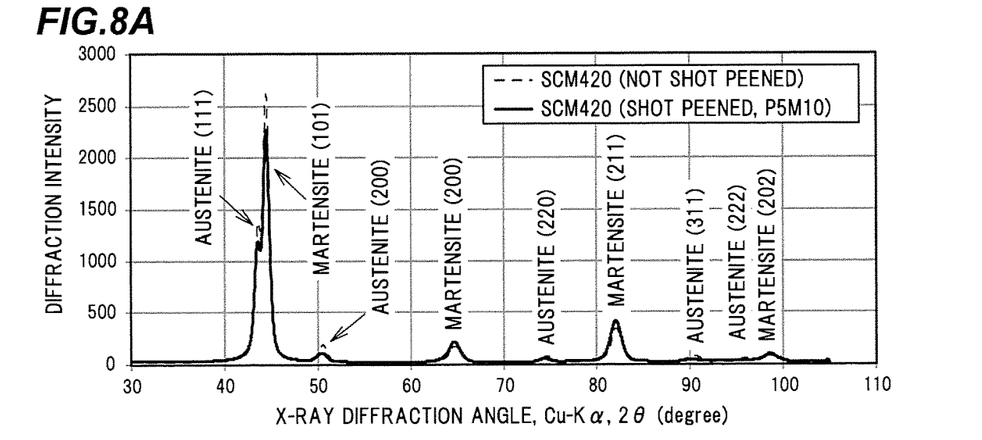
FIGS. 8A to 8C are graphs showing the result of an X-ray diffraction test conducted on the sample P5M10 of FIG. 7 and a non-shot-peened sample.
Figure 8B:
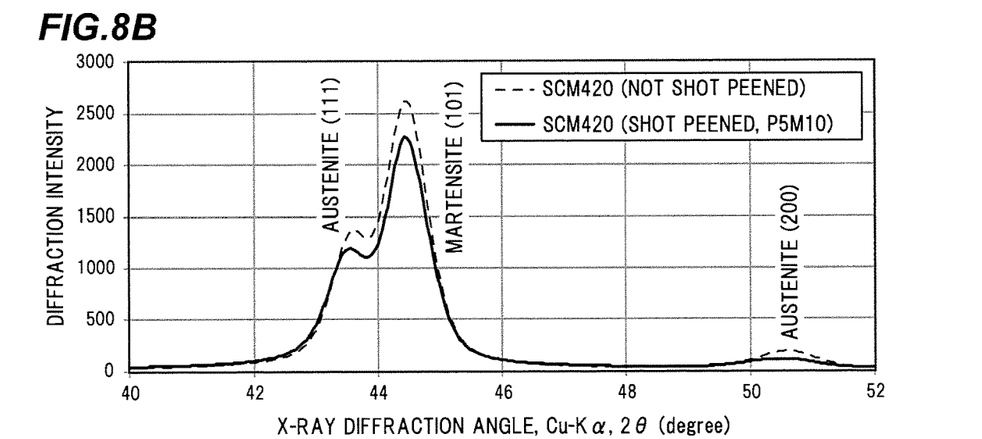
Figure 8C:
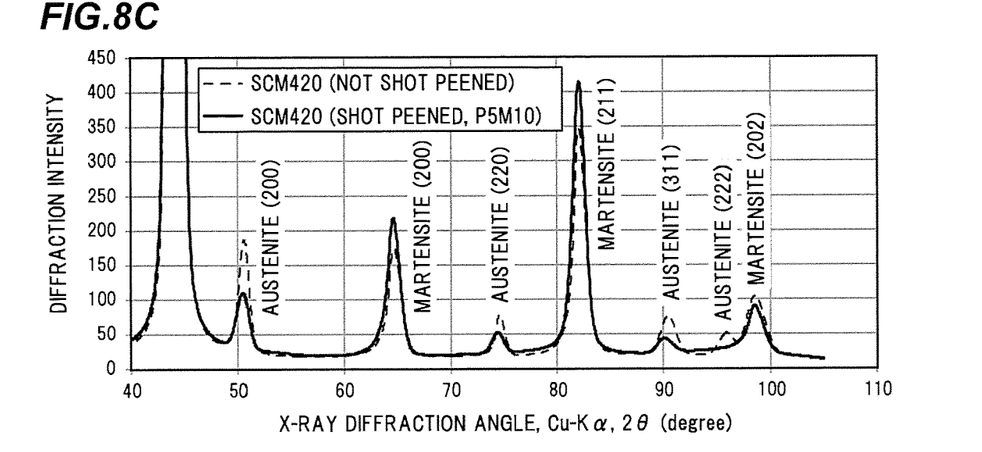

The X-ray diffraction test was also conducted on the chrome-molybdenum steel sample (P5M10) prepared at a jet pressure of 0.5 MPa for a jet exposure time of 2 minutes in the same manner as the chrome steel sample. The results are shown in FIGS. 8A to 8C. Here, FIG. 8A is partially enlarged and shown in FIGS. 8B and 8C. In FIGS. 8A to 8C, the result from a non-shot-peened sample (SCM420) is also shown for the purpose of comparison.

As shown in FIGS. 8A to 8C, the sample of the invention (shot-peened, P5M10) has less non-magnetic austenite and more ferromagnetic martensite than the non-shot-peened sample in the prior art example, and thus contributes to improvement in sensor sensitivity. In addition, a magnitude relation between the peak value of austenite with a Miller index of (200) and the peak value of martensite with a Miller index of (200) in the invention is a reverse of that in the prior art example. Furthermore, the peak values of the martensite (200) and martensite (211) are not less than 1.15 times the peak values before conducting shot peening.

Functions and Effects of the Embodiment

As described above, the method for manufacturing the shaft 100 in the present embodiment includes a heat treatment step to treat a chrome steel or chrome-molybdenum steel shaft material by carburizing, quenching and tempering, and a shot peening step to conduct shot peening on the shaft material after the heat treatment step at least on a position where the sensor portion is to be mounted, and the shot peening step is conducted by firing shot with a particle size of not less than 0.6 mm and a HRC of not less than 60 at a jet pressure of not less than 0.4 MPa for a jet exposure time of not less than 2 minutes.

By conducting the shot peening step, it is possible to reduce non-magnetic austenite only on the surface of the shaft 100 and thus possible to prevent decrease in toughness of the shaft 100. In addition, when using a shaft material formed of chrome steel or chrome-molybdenum steel, shot peening conducted by firing shot with a particle size of not less than 0.6 mm and a HRC of not less than 60 at a jet pressure of not less than 0.4 MPa for a jet exposure time of not less than 2 minutes allows for improvement in sensor sensitivity as well as reduction of hysteresis error.

In addition, by conducting the shot peening step at a jet pressure of not less than 0.4 MPa and less than 0.55 MPa for a jet exposure time of not less than 5 minutes, or at a jet pressure of not less than 0.55 MPa for a jet exposure time of not less than 2 minutes, it is possible to obtain sensor sensitivity of as high as not less than 4 mV/Nm and also possible to realize hysteresis error of as low as not more than 3% FS, in a wide temperature range of not less than −40° C. and not more than 150° C.

Furthermore, by conducting the shot peening step at a jet pressure of not less than 0.4 MPa and less than 0.55 MPa for a jet exposure time of not less than 10 minutes, or at a jet pressure of not less than 0.55 MPa for a jet exposure time of not less than 2 minutes, it is possible to reduce hysteresis error to not more than 2% FS and thus realize low hysteresis error of not more than 3% as a whole even after taking account of influence of noise or rotation of the shaft 100.

Additionally, by conducting the shot peening step at a jet pressure of not less than 0.55 MPa for a jet exposure time of not less than 2 minutes, it is possible to reduce time spent on the shot peening step while maintaining hysteresis error of not more than 2% FS, and thus possible to increase mass productivity.

In addition, by conducting the heat treatment step so that the shaft material after the heat treatment step has a HRC of not less than 58, worsening of sensor sensitivity and hysteresis error due to heat treatment can be prevented.

In addition, by conducting the shot peening step so that the shaft surface after the shot peening step has a surface roughness Ra of not more than 0.2, it is possible to reduce error due to the roughness of the surface of the shaft 100 and thus possible to detect torque with higher accuracy.

Summary of the Embodiments

Technical ideas understood from the embodiment will be described below citing the reference numerals, etc., used for the embodiments. However, each reference numeral, etc., described below is not intended to limit the constituent elements in the claims to the members, etc., specifically described in the embodiments.

[1] A method for manufacturing a magnetostrictive torque sensor shaft (100) mounting a sensor portion (2) of a magnetostrictive torque sensor (1), the method comprising: conducting heat treatment on a shaft material comprising chrome steel or chrome-molybdenum steel by carburizing, quenching and tempering; and conducting shot peening on the shaft material after the heat treatment at least on a position where the sensor portion (2) is to be mounted, wherein the shot peening is conducted by firing shot with a particle size of not less than 0.6 mm and a Rockwell hardness of not less than 60 at a jet pressure of not less than 0.4 MPa for a jet exposure time of not less than 2 minutes.

[2] The method defined by [1], wherein the shot peening is conducted at a jet pressure of not less than 0.4 MPa and less than 0.55 MPa for a jet exposure time of not less than 5 minutes, or is conducted at a jet pressure of not less than 0.55 MPa for a jet exposure time of not less than 2 minutes.

[3] The method defined by [1], wherein the shot peening is conducted at a jet pressure of not less than 0.4 MPa and less than 0.55 MPa for a jet exposure time of not less than 10 minutes, or is conducted at a jet pressure of not less than 0.55 MPa for a jet exposure time of not less than 2 minutes.

[4] The method defined by [1], wherein the shot peening is conducted at a jet pressure of not less than 0.55 MPa for a jet exposure time of not less than 2 minutes.

[5] The method defined by any one of [2] to [4], wherein the shaft material comprises chrome steel.

[6] The method defined by any one of [1] to [5], wherein the heat treatment is conducted so that the shaft material after the heat treatment has a Rockwell hardness of not less than 58.

Although the embodiment of the invention has been described, the invention according to claims is not to be limited to the embodiment. Further, please note that all combinations of the features described in the embodiment are not necessary to solve the problem of the invention.

The invention can be appropriately modified and implemented without departing from the gist thereof.

What is claimed is:
1. A method for manufacturing a magnetostrictive torque sensor shaft mounting a sensor portion of a magnetostrictive torque sensor, the method consisting of:
conducting heat treatment on a shaft material comprising chrome steel or chrome-molybdenum steel by carburizing for one time, quenching, and tempering for plural times such that the surface of the shaft material includes both austenite and martensite; and
conducting shot peening on the shaft material after the heat treatment at least on a continuous surface where the sensor portion is to be mounted,
wherein the shot peening is conducted by firing shot with a particle size of not less than 0.6 mm and not more than 0.8 mm and a Rockwell hardness of not less than 60 at a jet pressure of not less than 0.4 MPa and not more than 0.6 MPa for a jet exposure time of not less than 2 minutes only once such that further martensitic transformation occurs on the shaft material, such that peak values of martensite in the shaft material having a Miller index of 200 and martensite having a Miller index of 211, respectively, are not less than 1.15 times peak values of martensite in the shaft material with a Miller index of 200 and martensite having a Miller index of 211, respectively, before conducting shot peening, such that sensitivity of the resulting magnetostrictive torque sensor is not less than 4 mV/Nm, wherein hysteresis error of the magnetostrictive torque sensor is not more than 3% FS in a range of not less than −40° C. and not more than 150° C., and wherein the hardness of the shaft material after the heat treatment step is an HRC of not less than 59 and not more than 62, and wherein the shaft surface after the shot peening step has a surface roughness Ra of not more than 0.2 μm.

2. The method according to claim 1,
wherein the shaft material includes an Ni content that is no more than 0.25% by mass.

3. The method according to claim 1, wherein the shot peening is conducted at a jet pressure of not less than 0.4 MPa and less than 0.55 MPa for a jet exposure time of not less than 5 minutes, or is conducted at a jet pressure of not less than 0.55 MPa for a jet exposure time of not less than 2 minutes.

4. The method according to claim 3, wherein the shaft material comprises chrome steel.

5. The method according to claim 1, wherein the shot peening is conducted at a jet pressure of not less than 0.4 MPa and less than 0.55 MPa for a jet exposure time of not less than 10 minutes, or is conducted at a jet pressure of not less than 0.55 MPa for a jet exposure time of about 2 minutes.

6. The method according to claim 1, wherein the shot peening is conducted at a jet pressure of not less than 0.55 MPa for a jet exposure time of about 2 minutes.

7. The method according to claim 1, wherein the heat treatment is conducted so that the shaft material after the heat treatment has a Rockwell hardness of not less than 58.

8. The method according to claim 1,
wherein the quenching of the shaft material is marquenching, and wherein in the heat treatment of the shaft material, all of the plural tempering occurs after all marquenching of the shaft material has occurred.

9. The method according to claim 8,
wherein in the heat treatment of the shaft material, all of the plural tempering is performed at about 180° C. or less.

10. The method according to claim 1, wherein the shot peening is conducted by firing shot with a particle size of about 0.8 mm.

11. A method for manufacturing a magnetostrictive torque sensor shaft mounting a sensor portion of a magnetostrictive torque sensor, the method consisting of:
conducting heat treatment on a shaft material comprising chrome steel or chrome-molybdenum steel by carburizing for one time, quenching, and tempering for plural times such that the surface of the shaft material includes both austenite and martensite; and
conducting shot peening on the shaft material after the heat treatment at least on a continuous surface where the sensor portion is to be mounted,
wherein the shot peening is conducted by firing shot with a particle size of not less than 0.6 mm and not more than 0.8 mm and a Rockwell hardness of not less than 60 at a jet pressure of not less than 0.4 MPa and not more than 0.6 MPa for a jet exposure time of not less than 2 minutes only once such that further martensitic transformation occurs on the shaft material,
wherein the shot peening is conducted until a peak value of martensite in the shaft material with a Miller index of (200) is greater than a peak value of austenite in the shaft material with a Miller index of (200), wherein before the shot peening is conducted, the peak value of martensite in the shaft material with a Miller index of (200) is smaller than the peak value of austenite in the shaft material with a Miller index of (200), wherein peak values of martensite in the shaft material with a Miller index of (200) after conducting shot peening and martensite in the shaft material with a Miller index of (211) after conducting shot peening are not less than 1.15 times peak values of martensite in the shaft material with a Miller index of (200) and martensite in the shaft material with a Miller index of (211) before conducting shot peening, such that sensitivity of the resulting magnetostrictive torque sensor is not less than 4 mV/Nm, wherein hysteresis error of the magnetostrictive torque sensor is not more than 3% FS in a range of not less than −40° C. and not more than 150° C., wherein the hardness of the shaft material after the heat treatment step is an HRC of not less than 59 and not more than 62, and wherein the shaft surface after the shot peening step has a surface roughness Ra of not more than 0.2 μm.

12. The method according to claim 11,
wherein the shaft material includes an Ni content that is no more than 0.25% by mass.

13. The method according to claim 11, wherein the shot peening is conducted at a jet pressure of not less than 0.4 MPa and less than 0.55 MPa for a jet exposure time of not less than 5 minutes, or is conducted at a jet pressure of not less than 0.55 MPa for a jet exposure time of not less than 2 minutes.

14. The method according to claim 13, wherein the shaft material comprises chrome steel.

15. The method according to claim 11, wherein the shot peening is conducted at a jet pressure of not less than 0.4 MPa and less than 0.55 MPa for a jet exposure time of not less than 10 minutes, or is conducted at a jet pressure of not less than 0.55 MPa for a jet exposure time of about 2 minutes.

16. The method according to claim 11, wherein the shot peening is conducted at a jet pressure of not less than 0.55 MPa for a jet exposure time of about 2 minutes.

17. The method according to claim 11, wherein the heat treatment is conducted so that the shaft material after the heat treatment has a Rockwell hardness of not less than 58.

18. The method according to claim 11,
wherein the quenching of the shaft material is marquenching, and wherein in the heat treatment of the shaft material, all of the plural tempering occurs after all marquenching of the shaft material has occurred.

19. The method according to claim 18,
wherein in the heat treatment of the shaft material, all of the plural tempering is performed at about 180° C. or less.

20. The method according to claim 11, wherein the shot peening is conducted by firing shot with a particle size of about 0.8 mm.

* * * * *